(12) United States Patent
Tanaka (10) Patent No.: US 12,546,831 B2
(45) Date of Patent: Feb. 10, 2026

(54) POWER CONVERTER, DETERIORATION DETERMINATION DEVICE, AND DETERIORATION DETERMINATION METHOD

(71) Applicant: FUJI ELECTRIC CO., LTD., Kanagawa (JP)

(72) Inventor: Takaaki Tanaka, Tokyo (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 173 days.

(21) Appl. No.: 18/599,816

(22) Filed: Mar. 8, 2024

(65) Prior Publication Data

US 2024/0377473 A1     Nov. 14, 2024

(30) Foreign Application Priority Data

May 9, 2023   (JP) .................................. 2023-077503

(51) Int. Cl.
  *G01R 31/40*    (2020.01)
(52) U.S. Cl.
  CPC .................................... *G01R 31/40* (2013.01)
(58) Field of Classification Search
  CPC ...... G01R 31/40; G01R 31/42; G01R 19/165; G01R 31/2642; H02M 1/32; H02M 1/00; H02M 7/003; H02M 7/53871
  USPC .................................... 324/764.01, 537, 500
  See application file for complete search history.

(56) References Cited

U.S. PATENT DOCUMENTS

| 2022/0014013 | A1* | 1/2022 | Zhong | ..................... | G01R 31/42 |
| 2022/0059419 | A1 | 2/2022 | Kurosawa | | |
| 2023/0194625 | A1* | 6/2023 | Zafarana | ............. | H02M 3/1586 |
| | | | | | 324/764.01 |
| 2024/0313668 | A1* | 9/2024 | Shiraishi | ............. | H02M 1/0009 |

FOREIGN PATENT DOCUMENTS

JP            2022-036633         3/2022

* cited by examiner

*Primary Examiner* — Giovanni Astacio-Oquendo
(74) *Attorney, Agent, or Firm* — IPUSA, PLLC (57) ABSTRACT

A power converter includes a semiconductor device including a semiconductor element having first and second main electrodes and a control electrode, a first main terminal connected to the first main electrode, a second main terminal connected to the second main electrode, an auxiliary terminal connected to the second main electrode, and a control terminal connected to the control electrode. The power converter further includes a circuit generating a command for switching the semiconductor element, a circuit applying a drive voltage to the control electrode according to the command, a circuit detecting a voltage between the auxiliary and second main terminals, a circuit generating a trigger signal when the detected voltage becomes greater than or equal to a threshold voltage, and a circuit determining deterioration of the semiconductor device, using a determination value corresponding to a current flowing between the first and second main terminals in response to the trigger signal.

12 Claims, 9 Drawing Sheets

POWER CONVERTER, DETERIORATION DETERMINATION DEVICE, AND DETERIORATION DETERMINATION METHOD

CROSS-REFERENCE TO RELATED APPLICATIONS

This application is based upon and claims priority to Japanese Patent Application No. 2023-077503, filed on May 9, 2023, the entire contents of which are incorporated herein by reference.

FIELD

Certain aspects of the embodiments discussed herein are related to power converters, deterioration determination devices, and deterioration determination methods.

BACKGROUND

Conventionally, a known deterioration detection circuit detects deterioration of a junction of a semiconductor element based on a gate voltage between one of main electrode terminals and a gate electrode terminal of the semiconductor element, and a voltage between the one of the main electrode terminals and the other of the main electrode terminals, and outputs an alarm signal. An example of such a deterioration detection circuit is proposed in Japanese Laid-Open Patent Publication No. 2022-36633, for example.

However, the conventional deterioration detection circuit has room for improving an accuracy of determining the deterioration of the semiconductor element.

SUMMARY

The present disclosure provides a power converter, a deterioration determination device, and a deterioration determination method capable of accurately determining deterioration of a semiconductor device.

According to one aspect of the present disclosure, a power converter includes a semiconductor device including a semiconductor element having a first main electrode, a second main electrode, and a control electrode, a first main terminal electrically connected to the first main electrode, a second main terminal electrically connected to the second main electrode, an auxiliary terminal electrically connected to the second main electrode, and a control terminal electrically connected to the control electrode; a command circuit configured to generate a command for switching the semiconductor element; a drive circuit configured to apply a drive voltage to the control electrode according to the command; a voltage detection circuit configured to detect a voltage between the auxiliary terminal and the second main terminal; a trigger circuit configured to generate a trigger signal when the voltage detected by the voltage detection circuit becomes greater than or equal to a threshold voltage; and a deterioration determination circuit configured to determine deterioration of the semiconductor device, using a determination value corresponding to a current flowing between the first main terminal and the second main terminal in response to the trigger signal.

According to another aspect of the present disclosure, a deterioration determination device includes a semiconductor device including a semiconductor element having a first main electrode and a second main electrode, a first main terminal electrically connected to the first main electrode, a second main terminal electrically connected to the second main electrode, and an auxiliary terminal electrically connected to the second main electrode; a voltage detection circuit configured to detect a voltage between the auxiliary terminal and the second main terminal, or a voltage between the first main terminal and the second main terminal; a trigger circuit configured to generate a trigger signal when the voltage detected by the voltage detection circuit becomes greater than or equal to a threshold voltage; and a deterioration determination circuit configured to determine deterioration of the semiconductor device, using a determination value corresponding to a current flowing between the first main terminal and the second main terminal in response to the trigger signal.

According to still another aspect of the present disclosure, a deterioration determination method determines deterioration of a semiconductor device including a semiconductor element having a first main electrode and a second main electrode, a first main terminal electrically connected to the first main electrode, a second main terminal electrically connected to the second main electrode, and an auxiliary terminal electrically connected to the second main electrode, and the deterioration determination method includes detecting a voltage between the auxiliary terminal and the second main terminal, or a voltage between the first main terminal and the second main terminal; generating a trigger signal when the voltage detected by the detecting is greater than or equal to a threshold voltage; and determining deterioration of the semiconductor device, using a determination value corresponding to a current flowing between the first main terminal and the second main terminal in response to the trigger signal.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Hereinafter, embodiments of the present disclosure will be described.

In recent years, power converters are used in a wider range of applications (power systems, moving bodies, such as trains, automobiles, or the like) requiring high reliability. For this reason, there are increased demands to further improve the high reliability of the power converters. In order to satisfy such demands, there are high expectations for predictive maintenance, that predicts a failure and takes suitable measures in advance, to be realized.

One of the main causes of the failure of the power converter is a semiconductor device, such as a power semiconductor module or the like. The semiconductor device includes a semiconductor element, such as a semiconductor chip or the like. A main failure of the semiconductor device occurs when a thermal stress repeatedly generated by a current flow or a switching operation of the semiconductor element deteriorates a bonding wire or solder.

When a semiconductor device mounted on a power electronics device, such as a power converter or the like, continues to operate in a deteriorated state, the semiconductor device or the power electronics device may fail. For this reason, there are increased demands to accurately detect the deterioration and perform condition based maintenance (CBM).

A power converter, a deterioration determination device, and a deterioration determination method according to one embodiment can accurately determine the deterioration of the semiconductor device. Hereinafter, the power converter, the deterioration determination device, and the deterioration determination method according to one embodiment will be described.

<Power Converter>

Figure 1:
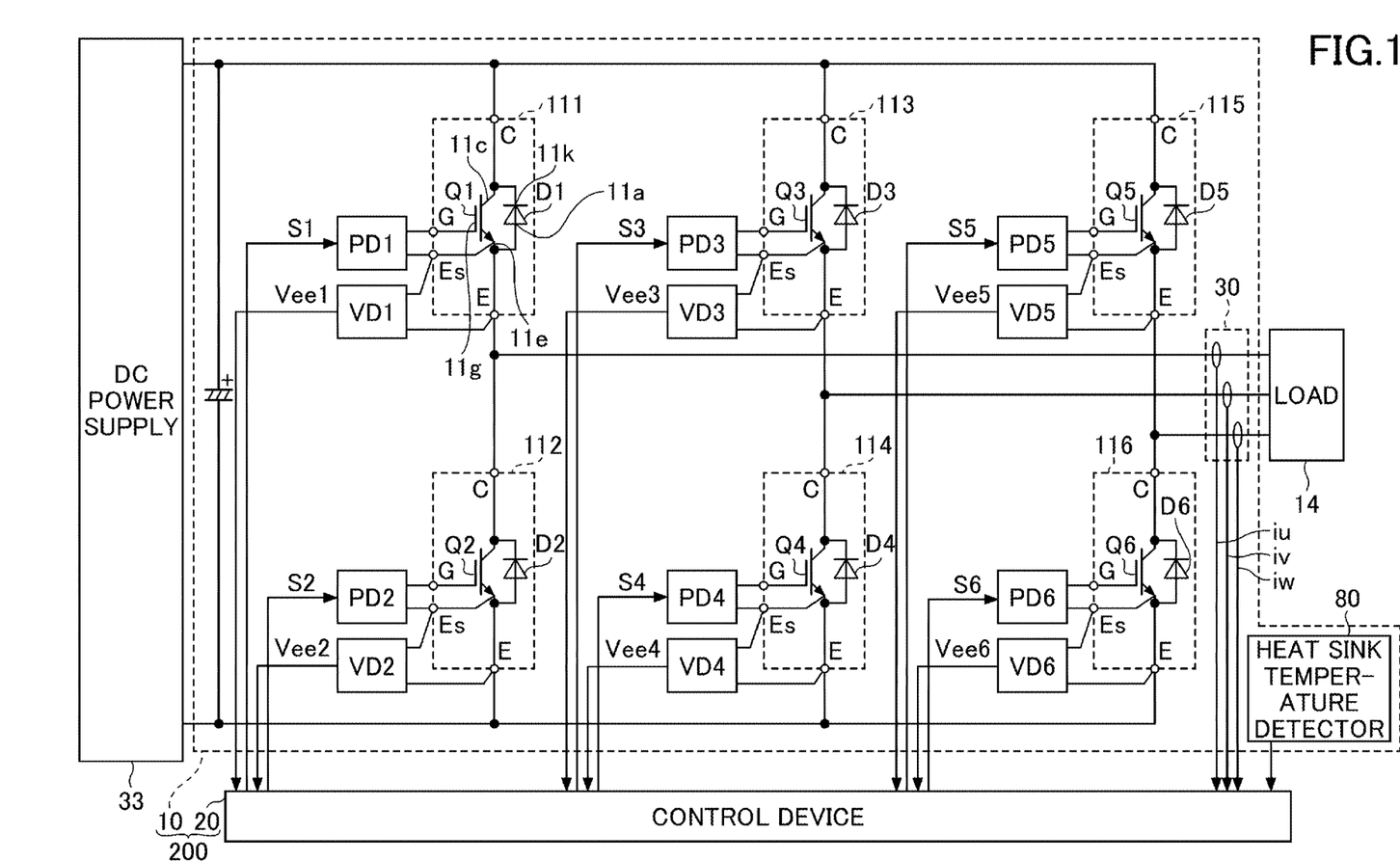
FIG. 1 is a diagram illustrating a configuration example of a power converter according to one embodiment.

FIG. 1 is a diagram illustrating a configuration example of the power converter according to one embodiment. A power converter 200 illustrated in FIG. 1 includes a main circuit 10 that converts DC power supplied from a DC power supply 33 into AC power to be supplied to a load 14, and a control device 20 that controls a power conversion operation of the main circuit 10. FIG. 1 illustrates a mode in which the main circuit 10 converts the DC power into AC power of three phases.

The main circuit 10 includes a plurality of power semiconductor modules 111 through 116, a plurality of voltage detection circuits VD1 through VD6, a plurality of gate drive circuits PD1 through PD6, and a current detection circuit 30. The power semiconductor modules 111 through 116 are examples of semiconductor devices for power conversion.

FIG. 1 illustrates, as an example of a power semiconductor module, a 1-in-1 package insulated gate bipolar transistor (IGBT) module. The 1-in-1 package IGBT module is embedded with an IGBT chip corresponding to one arm of an inverter, and a diode chip (forward (FWD) chip) connected anti-parallel to the IGBT chip. The IGBT chip is an example of a power semiconductor element, and the FWD chip is an example of a rectifier. However, the power semiconductor module may have a package configuration other than the 1-in-1 package configuration, such as a 6-in-1 package configuration or the like. Further, the power semiconductor element provided in the power semiconductor module may be other than the IGBT chip, such as a metal oxide semiconductor field effect transistor (MOSFET) or the like.

The plurality of power semiconductor modules 111 through 116 may have the same configuration, the plurality of voltage detection circuits VD1 through VD6 may have the same configuration, and the plurality of gate drive circuits PD1 through PD6 may have the same configuration.

The power semiconductor module 111 for an upper arm of a U-phase includes an IGBT chip Q1 and an FWD chip D1. The power semiconductor module 111 has a collector terminal C, an emitter terminal E, a gate terminal G, and an auxiliary emitter terminal Es. The collector terminal C is an example of a first main terminal, the emitter terminal E is an example of a second main terminal, the gate terminal G is an example of a control terminal, and the auxiliary emitter terminal Es is an example of an auxiliary terminal.

The IGBT chip Q1 is an example of a switching element (semiconductor element) having a collector electrode $11c$, an emitter electrode $11e$, and a gate electrode $11g$. The collector electrode $11c$ is an example of a first main electrode, the emitter electrode $11e$ is an example of a second main electrode, and the gate electrode $11g$ is an example of a control electrode.

The FWD chip D1 is an example of a rectifier (semiconductor element) having an anode electrode $11a$ and a cathode electrode $11k$.

The collector terminal C is electrically connected to the collector electrode $11c$ and the cathode electrode $11k$. The emitter terminal E is electrically connected to the emitter electrode $11e$ and the anode electrode $11a$. The gate terminal G is electrically connected to the gate electrode $11g$. The auxiliary emitter terminal Es is electrically connected to the emitter electrode $11e$ and the anode electrode $11a$.

The power semiconductor module 112 for a lower arm of the U-phase includes an IGBT chip Q2 and an FWD chip D2. The power semiconductor module 113 for an upper arm of a V-phase includes an IGBT chip Q3 and an FWD chip D3. The power semiconductor module 114 for a lower arm of the V-phase includes an IGBT chip Q4 and an FWD chip D4. The power semiconductor module 115 for an upper arm of a W-phase includes an IGBT chip Q5 and an FWD chip D5. The power semiconductor module 116 for a lower arm of the W-phase includes an IGBT chip Q6 and an FWD chip D6. The power semiconductor modules 112 through 116 have the same configuration as the power semiconductor module 111 described above.

The gate drive circuit PD1 is a circuit that drives the gate electrode $11g$ of the IGBT chip Q1, according to an on or off switching command S1 supplied from the control device 20. Similarly, the gate drive circuits PD2 through PD6 are circuits that drive the gate electrodes $11g$ of the IGBT chips Q2 through Q6, according to on or off switching commands S2 through S6 supplied from the control device 20, respectively. The gate drive circuits PD1 through PD6 are drive circuits that apply drive voltages for switching the IGBT chips Q1 through Q6 of the power semiconductor modules 111 through 116 between the gate terminals G and the auxiliary emitter terminals Es, respectively, according to the switching commands S1 through S6 from the control device 20.

The voltage detection circuit VD1 is a circuit that detects a voltage Vee1 between the auxiliary emitter terminal Es and the emitter terminal E of the power semiconductor module 111, and transmits a detection value of the voltage Vee1 to the control device 20. Similarly, the voltage detection circuits VD2 through VD6 are circuits that detect voltages Vee2 through Vee6 between the auxiliary emitter terminals Es and the emitter terminals E of the power semiconductor modules 112 through 116, respectively, and transmit detection values of the voltages Vee2 through Vee6 to the control device 20.

The current detection circuit 30 detects alternating currents (AC currents) iu, iv, and iw of three phases flowing between the power semiconductor modules 111 through 116 and the load 14, and transmits detection values of the AC currents iu, iv, and iw to the control device 20. The current detection circuit 30 includes current sensors that detect the AC currents iu, iv, and iw of three phases, for example. The AC currents iu, iv, and iw are load currents flowing through the load 14.

The control device 20 is a control device including a processor, such as a central processing unit (CPU) or the like, and a memory, for example. Functions of the control device 20 can be implemented in the processor operating according to a program stored in the memory. The functions of the control device 20 may be implemented in a field programmable gate array (FPGA) or an application specific integrated circuit (ASIC).

The main circuit 10 may include a heat sink temperature detector 80. The heat sink temperature detector 80 detects a temperature of a heat sink (for example, a fin or the like) for cooling the power semiconductor modules 111 through 116, and transmits a temperature detection value Th of the heat sink to the control device 20. The heat sink temperature detector 80 includes a temperature sensor that detects the temperature of the heat sink, for example. For example, the temperature sensor may be provided to detect the temperature of a single heat sink that is provided in common with respect to the plurality of power semiconductor modules 111 through 116, or a plurality of temperature sensors may be provided to detect the temperatures of a plurality of heat sinks provided with respect to the plurality of power semiconductor modules 111 through 116, respectively.

<Semiconductor Device>

Figure 2:
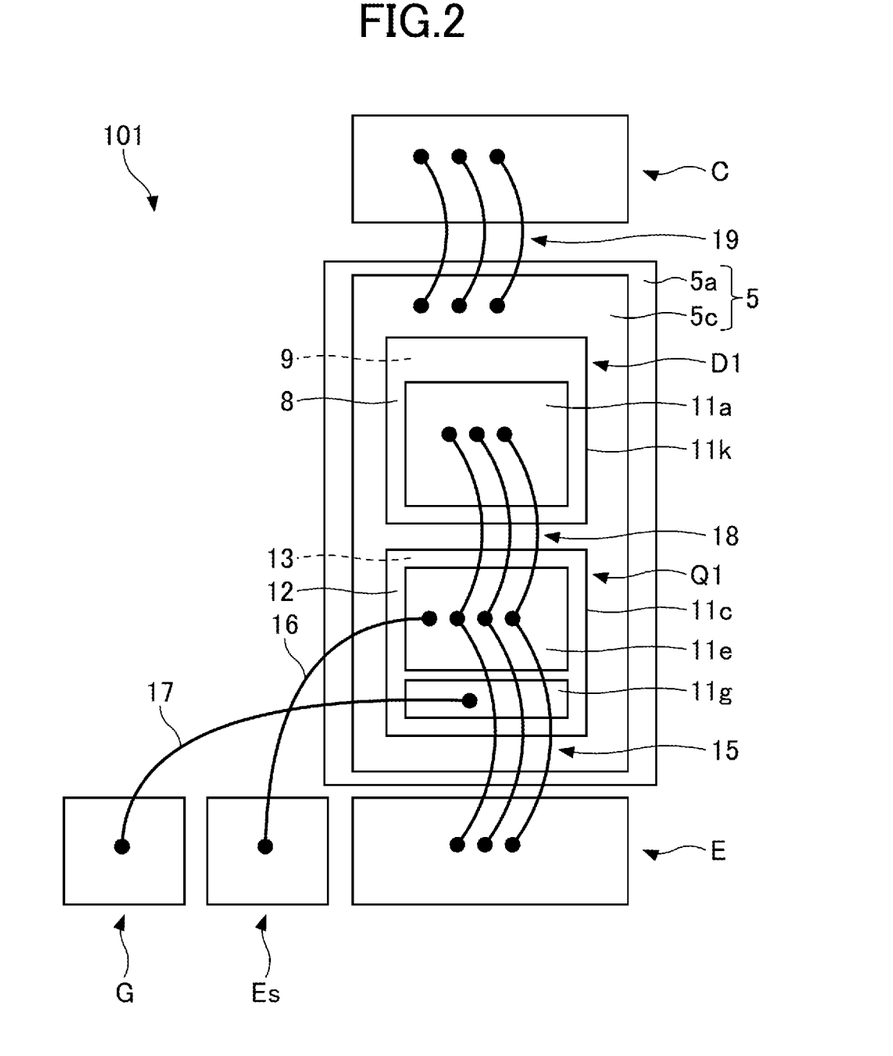
FIG. 2 is a plan view illustrating a configuration example of a semiconductor device according to one embodiment.

FIG. 2 is a plan view illustrating a configuration example of the semiconductor device according to the present embodiment. FIG. 2 illustrates a circuit configuration of one arm of the inverter, for example. In the case of the circuit configuration of the upper arm of the U-phase, a semiconductor device 101 corresponds to the power semiconductor module 111 described above, for example. Because the circuit configurations of the arms are the same, the upper arm of the U-phase will be described as an example in the following, unless otherwise indicated.

The semiconductor device 101 illustrated in FIG. 2 includes an insulating substrate 5, a collector terminal C, an emitter terminal E, an auxiliary emitter terminal Es, a gate terminal G, an IGBT chips Q1, an FWD chip D1, and wires 15, 16, 17, 18, and 19.

The insulating substrate 5 is a substrate on which the IGBT chip Q1 and the FWD chip D1 are mounted, and for example, a direct copper bonding (DCB) substrate, an active metal brazing (AMB) substrate, or the like can be used for the insulating substrate 5. The insulating substrate 5 is fixed on a base substrate (not illustrated) via a bonding material, such as solder or the like.

The insulating substrate 5 includes an insulating layer 5a and an interconnect layer 5c. The insulating layer 5a is a ceramic plate, for example. The interconnect layer 5c is provided on an upper surface of the insulating layer 5a, and is a conductor layer formed of a conductive metal, such as copper or the like, for example. The interconnect layer 5c includes at least one conductor pattern.

The IGBT chip Q1 is a semiconductor element embedded in the semiconductor device 101, and is a semiconductor switching element having electrodes on a front surface 12 and a back surface 13, respectively. The IGBT chip Q1 may be a Si semiconductor element or a SiC semiconductor element.

The IGBT chip Q1 has the front surface 12 on which the emitter electrode 11e and the gate electrode 11g are formed, and the back surface 13 on which the collector electrode 11c is formed. The collector electrode 11c is an example of first main electrode of the IGBT chip Q1. The emitter electrode 11e is an examples of the second main electrode of the IGBT chip Q1. The gate electrode 11g is an examples of the control electrode of the IGBT chip Q1. The IGBT chip Q1 is fixed on the insulating substrate 5 at the back surface 13 by bonding the collector electrode 11c to the conductor pattern of the interconnect layer 5c using a bonding material, such as solder or the like.

The FWD chip D1 is a semiconductor element embedded in the semiconductor device 101, and is a diode element having electrodes on a front surface 8 and a back surface 9, respectively. The FWD chip D1 may be a Si semiconductor element or a SiC semiconductor element.

The FWD chip D1 has the front surface 8 on which the anode electrode 11a is formed, and the back surface 9 on which the cathode electrode 11k is formed. The FWD chip D1 is fixed on the insulating substrate 5 at the back surface 9 by bonding the cathode electrode 11k to the conductor pattern of the interconnect layer 5c using a bonding material, such as solder or the like. The cathode electrode 11k is electrically connected to the collector electrode 11c by the conductor pattern of the interconnect layer 5c.

The collector terminal C, the emitter terminal E, the gate terminal G, and the auxiliary emitter terminal Es are external electrodes for connecting the semiconductor device 101 to an external element or the like. Each of these external terminals is formed in a cylindrical shape or a flat plate shape, using a conductive metal, such as copper, aluminum, or the like, for example.

The collector terminal C is electrically connected to the collector electrode 11c and the cathode electrode 11k via the wires 19.

The emitter terminal E is electrically connected to the emitter electrode 11e via the wires 15, and the emitter terminal E is electrically connected to the anode electrode 11a via the wires 18.

The gate terminal G is electrically connected to the gate electrode 11g via the wires 17.

The auxiliary emitter terminal Es is electrically connected to the emitter electrode 11e via the wires 16.

The wires 15 through 19 are bonding wires formed using a conductive metal, such as copper, aluminum or the like, or a conductive alloy, such as an iron-aluminum alloy or the like, for example. The wire 15 is formed of one or more (for example, three) wire members that connect the emitter electrode 11e of the IGBT chip Q1, which is the front electrode, to the conductor pattern of the interconnect layer provided with the emitter terminal E. The wire 16 is formed by one or more (for example, one) wire members that connect the emitter electrode 11e of the IGBT chip Q1, which is the front electrode of the IGBT chip Q1, to the conductor pattern of the interconnect layer provided with the auxiliary emitter terminal Es. The wire 17 is formed of one or more (for example, one) linear wires that connect the gate electrode 11g of the IGBT chip Q1, which is the front electrode of the IGBT chip Q1, to the conductor pattern of the interconnect layer provided with the gate terminal G.

The wire 18 is formed of one or more (for example, three) linear wires that connect the emitter electrode 11e of the IGBT chip Q1, which is the front electrode of the IGBT chip Q1, and the anode electrode 11a of the FWD chip D1, which is the front electrode of the FWD chip D1. The wire 19 is formed of one or more (for example, three) wire members that connect the conductor pattern of the interconnect layer 5c and the conductor pattern of the interconnect layer provided with the collector terminal C. The wire 15 is an example of a first wire or a main wire. The wire 16 is an example of a second wire or an auxiliary wire.

A current Ic flowing through the semiconductor device 101 flows through the wires 15, 18, and 19, but does not flow through the wire 16 and 17. The current Ic flowing into the semiconductor device 101 flows to the collector electrode 11c through the conductor pattern of the interconnect layer 5c and the bonding material, and passes through the IGBT chip Q1. Further, the current Ic output from the emitter electrode 11e flows to the emitter terminal E through the wire 15 and the conductor pattern. On the other hand, the current Ic flowing into the semiconductor device 101 from the emitter terminal E flows to the anode electrode 11a through the conductor pattern and the wires 15 and 18, and passes through the FWD chip D1. Then, the current Ic output from the cathode electrode 11k or the collector electrode 11c flows to the collector terminal C through the bonding material, the conductor pattern of the interconnect layer 5c, and the wire 19.

Each of the IGBT chip Q1 and the FWD chip D1 is thermally connected through a path including the bonding material, the insulating substrate 5, the bonding material, the base substrate, thermal grease, and the heat sink in this order. The heat is radiated from the heat sink to the outside air, and thus, each of the IGBT chip Q1 and the FWD chip D1 can be cooled.

It is known that the semiconductor device 101 deteriorates due to repeated heat generation caused by a current flowing through each chip and switching in each chip. Main portions that deteriorate include a wire bonding portion between the wire and the chip or the interconnect pattern, the bonding material such as solder or the like provided under the chip, or the like. When the wire bonding portion deteriorates, mainly the electrical resistance of the wire bonding portion increases, and when the bonding material such as solder or the provided under the chip deteriorates, mainly the thermal resistance of the bonding material increases. The thermal grease deteriorates with changes in the temperature of the semiconductor device 101 or the heat sink. When the thermal grease deteriorates, the thermal resistance of the thermal grease increases. When fins of the heat sink clogs, a blower fan fails, or the like, the thermal resistance of the heat sink increases.

Deterioration Determination Device According To First Embodiment

Figure 3:
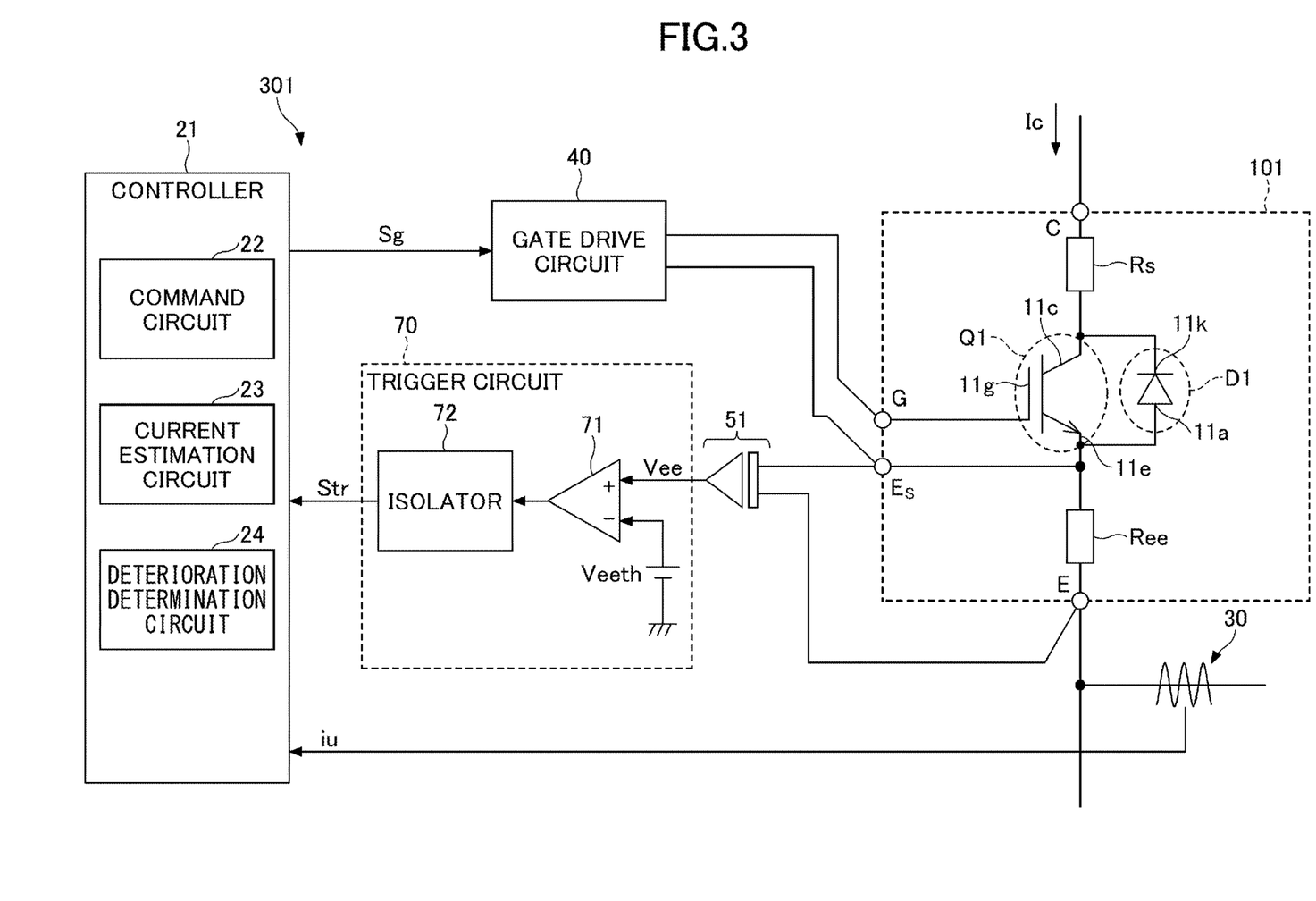
FIG. 3 is a diagram illustrating a configuration example of a deterioration determination device according to a first embodiment.

FIG. 3 is a diagram illustrating a configuration example of a deterioration determination device according to a first embodiment. A deterioration determination device 301 illustrated in FIG. 3 determines the deterioration of the semiconductor device 101. FIG. 3 illustrates a circuit configuration for one arm of the inverter, for example. In the case of the circuit configuration for the upper arm of the U-phase, the semiconductor device 101 corresponds to the power semiconductor module 111 described above, for example. Because the circuit configurations of the arms are the same, the upper arm of the U-phase will be described as an example in the following, unless otherwise indicated. FIG. 3 illustrates an electrical resistance component Rs including the bonding material and the wire 19 (refer to FIG. 2) between the collector terminal C and the collector electrode 11c, and an electrical resistance component Ree including the wire 15 (refer to FIG. 2) between the emitter terminal E and the emitter electrode 11e.

As the deterioration of an electrical connecting portion between the emitter electrode 11e and the emitter terminal E progresses, the electrical resistance component Ree increases. The deterioration determination device 301 illustrated in FIG. 3 determines the deterioration of the semiconductor device 101 by detecting the increase in the electrical resistance component Ree.

Next, a configuration of the deterioration determination device 301 will be described. The deterioration determination device 301 includes the semiconductor device 101, a gate drive circuit 40, a voltage detection circuit 51, a current detection circuit 30, a trigger circuit 70, and a controller 21.

The gate drive circuit 40 is a drive circuit that applies a drive voltage for switching the IGBT chip Q1 of the semiconductor device 101 between the gate terminal G and the auxiliary emitter terminal Es of the semiconductor device 101, according to a switching command Sg from the controller 21. The gate drive circuit 40 corresponds to the gate drive circuit PD1 described above, for example. The switching command Sg corresponds to the switching command S1 described above that instructs the switching timing (turn-on timing and turn-off timing) of the IGBT chip Q1.

The voltage detection circuit 51 is a circuit that detects a voltage Vee between the auxiliary emitter terminal Es and the emitter terminal E of the semiconductor device 101, and outputs the detected voltage Vee to the trigger circuit 70.

The current detection circuit 30 detects an AC current iu output from the collector terminal C or the emitter terminal E, and outputs a detection value of the AC current iu to the controller 21.

The trigger circuit 70 is a circuit that generates a trigger signal Str when the voltage Vee detected by the voltage detection circuit 51 becomes greater than or equal to a threshold voltage Veeth. The trigger signal Str indicates that the voltage Vee detected by the voltage detection circuit 51 is greater than or equal to the threshold voltage Veeth. The trigger signal Str may also be referred to as a timing signal. The trigger circuit 70 triggered to output the trigger signal Str when the voltage Vee detected by the voltage detection circuit 51 becomes greater than or equal to the threshold voltage Veeth.

The trigger circuit 70 may be provided in the controller 21.

In this example, the trigger circuit 70 includes a comparator 71 and an isolator 72.

The comparator 71 compares the voltage Vee detected by the voltage detection circuit 51 with the predetermined threshold voltage Veeth. The comparator 71 asserts the trigger signal Str when the detected voltage Vee is greater than or equal to the threshold voltage Veeth (in this example, a logic level of the trigger signal Str is set to a high level). On the other hand, when the detected voltage Vee is lower than the threshold voltage Veeth, the comparator 71 negates the trigger signal Str (in this example, the logic level of the trigger signal Str is set to a low level).

The isolator 72 transfers the trigger signal Str output from the comparator 71 to the controller 21, in a state where the electrical insulation between the comparator 71 and the controller 21 is secured. Specific examples of the isolator 72 include a photocoupler or the like.

The controller 21 is a controller that controls switching of the semiconductor device 101. The controller 21 corresponds to the control device 20 (refer to FIG. 1) described above, but may be a controller different from the control device 20. The controller 21 includes a command circuit 22, a current estimation circuit 23, and a deterioration determination circuit 24.

The command circuit 22 generates the switching command Sg for switching the IGBT chip Q1, based on the detection values of the AC currents iu, iv, and iw or the like acquired from the current detection circuit 30.

The current Ic flows through the semiconductor device 101. A polarity of the current Ic is assumed to be positive when the current Ic flows from the collector terminal C to emitter terminal E through the IGBT chip Q1, and is assumed to be negative when the current Ic flows from the emitter terminal E to the collector terminal C through the FWD chip D1. In the case of the inverter, the current estimation circuit 23 of the controller 21 can determine the direction of flow (that is, the positive or negative polarity of) the current Ic, based on the AC currents iu, iv, and iw acquired from the current detection circuit 30 and the state of the on command or the off command of the switching command Sg acquired from the command circuit 22.

Figure 4:
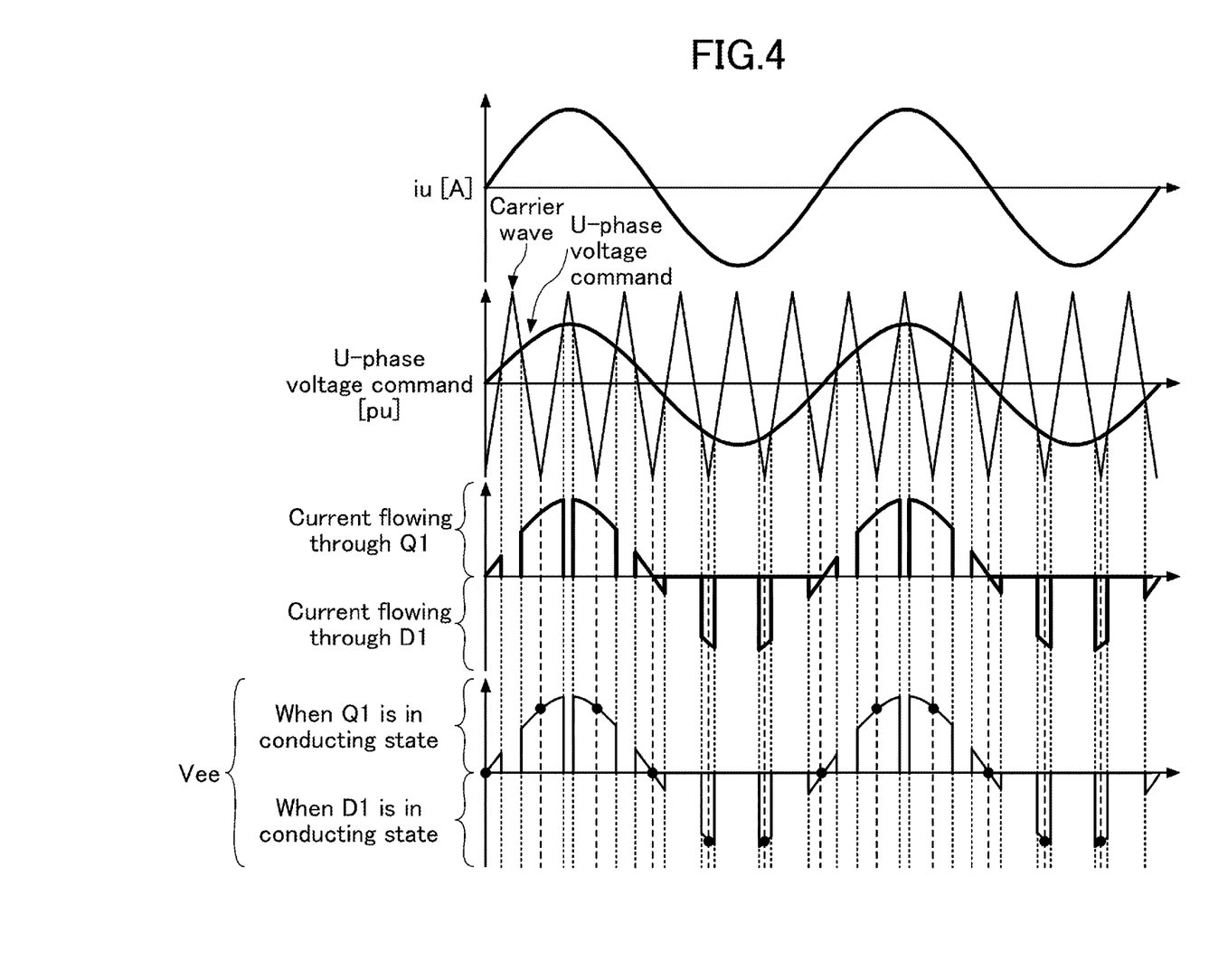
FIG. 4 is a timing chart illustrating examples of waveforms at parts associated with a detection operation to detect a current Ic in a conducting state between both main terminals of the semiconductor device.

FIG. 4 is a timing chart illustrating examples of waveforms at parts associated with the detection operation to detect the current Ic in a conducting state between both main terminals of the semiconductor device. In the illustrated example of FIG. 4, the AC current iu is a sinusoidal load current, and the U-phase voltage command is a sinusoidal voltage. The on state and off state of the upper and lower arms of the U-phase are determined by a magnitude relationship between the U-phase voltage command and the carrier wave. In the illustrated example of FIG. 4, the control device 20 outputs the switching command S1 for turning on the IGBT chip Q1 and turning off the IGBT chip Q2 during a period in which the U-phase voltage command is greater than or equal to the carrier wave. On the other hand, the control device 20 outputs the switching command S1 for turning off the IGBT chip Q1 and turning on the IGBT chip Q2 during a period in which the U-phase voltage command is smaller than the carrier wave.

When the IGBT chip Q1 is on and the AC current iu is positive, a current that is the same as the AC current iu flows through the IGBT chip Q1. When the IGBT chip Q2 is off and the AC current iu is negative, a current that is the same as the AC current iu flows through the FWD chip D1.

When the trigger signal Str is input (asserted), the current estimation circuit 23 (refer to FIG. 3) acquires the detection value of the current iu from the current detection circuit 30. The trigger signal Str is asserted when the detected voltage Vee is greater than a positive threshold voltage Veeth.

The current estimation circuit 23 samples the detection value of the current iu detected by the current detection circuit 30 at a timing corresponding to the trigger signal Str. Thus, the current estimation circuit 23 can estimate the value of the current Ic flowing at the timing corresponding to the trigger signal Str, in a state (a conducting state A) where the current Ic flows from the collector terminal C to the emitter terminal E through the IGBT chip Q1 and the electrical resistance component Ree.

The method of detecting the current Ic between the main terminals when the IGBT chip is in the on state (conducting state) is not limited to the method described above. For example, the current Ic between the main terminals may be measured by a current measuring means, such as a Rogowski coil or the like.

As described above, when the semiconductor device 101 illustrated in FIG. 3 is in the conducting state, a main current (the current Ic in this example) flows between the collector terminal C and the emitter terminal E (between the main terminals). When the current Ic flows between the main terminals, a voltage drop between the main terminals of the semiconductor device 101 includes a voltage drop between the collector terminal C and the emitter electrode 11e, and a voltage drop between the emitter electrode 11e and the emitter terminal E.

The voltage drop between the collector terminal C and the emitter electrode 11e mainly includes a voltage drop in the IGBT chip Q1, and a voltage drop due to the electrical resistance component Rs including the bonding material, such as the solder or the like, provided under the chip. The voltage drop between the emitter electrode 11e and the emitter terminal E mainly includes the voltage drop due to the electrical resistance component Ree including the wire 15 electrically connecting the emitter electrode 11e and the emitter terminal E.

The deterioration determination circuit 24 computes an estimated value of the electrical resistance component Ree, by dividing the threshold voltage Veeth by the current (the current Ic flowing at the timing corresponding to the trigger signal Str) estimated by the current estimation circuit 23. The deterioration determination circuit 24 uses the estimated value of the electrical resistance component Ree as a determination value for determining the deterioration of the semiconductor device 101.

The deterioration determination circuit 24 may determine the deterioration of the semiconductor device 101, by comparing the estimated value of the electrical resistance component Ree with a predetermined determination level. For example, when the estimated value of the electrical resistance component Ree is detected as exceeding the predetermined determination level, the deterioration determination circuit 24 determines that the deterioration of the semiconductor device 101 (the electrical connecting portion between the emitter electrode 11e and the emitter terminal E) occurred, and issues an alarm to notify the deterioration.

As described above, the deterioration determination device 301 according to the present embodiment determines the deterioration of the semiconductor device 101, using the determination value corresponding to the current (the current Ic flowing at the timing corresponding to the trigger signal Str) estimated by the current estimation circuit 23. Thus, the current Ic flowing at a specific timing synchronized to the timing at which the voltage Vee detected by the voltage detection circuit 51 becomes greater than or equal to the threshold voltage Veeth is also taken into consideration by the determination value, thereby improving the accuracy of determining the deterioration. The specific timing synchronized to the timing at which the voltage Vee detected by the voltage detection circuit 51 becomes greater than or equal to the threshold voltage Veeth is not necessarily the same timing as an instant (a timing) when the voltage Vee becomes greater than or equal to the threshold voltage Veeth.

For example, the determination value corresponding to the current Ic flowing at the same timing as the timing when the voltage Vee detected by the voltage detection circuit 51 immediately after the turn-on of the IGBT chip Q1 becomes greater than or equal to the threshold voltage Veeth does not necessarily have to be used as the determination value for determining the deterioration of the semiconductor device 101. This is because, in the period immediately after the turn-on of the IGBT chip Q1, there is a high possibility that an excessively large current Ic flows due to a surge current or the like when compared to a steady state. Accordingly, by determining the deterioration of the semiconductor device 101 using the determination value corresponding to the current Ic flowing in the steady state excluding immediately after the turn-on of the IGBT chip Q1, it is possible to reduce the possibility of the deterioration determination device 301 erroneously determining the deterioration of the semiconductor device 101 at a stage where the deterioration of the semiconductor device 101 has not progressed.

The deterioration determination device 301 measures the deterioration of the semiconductor device 101 by measuring the current Ic flowing at the timing corresponding to the trigger signal Str. That is, because the trigger signal Str may be input to the controller 21 in order to measure the deterioration, only the output of the comparator 71 needs to be electrically insulated from the semiconductor device 101 which becomes a high potential part. That is, an analog-to-digital converter (ADC) having a withstand voltage performance for inputting the voltage (the voltage Vee in FIG. 3) of the semiconductor device 101 which becomes the high potential part to the controller 21 is not required. For this reason, the deterioration determination device 301 can determine the deterioration of the semiconductor device 101 using a simple configuration.

Next, the configuration and operation of the deterioration determination device 301 will be described in more detail.

Figure 5:
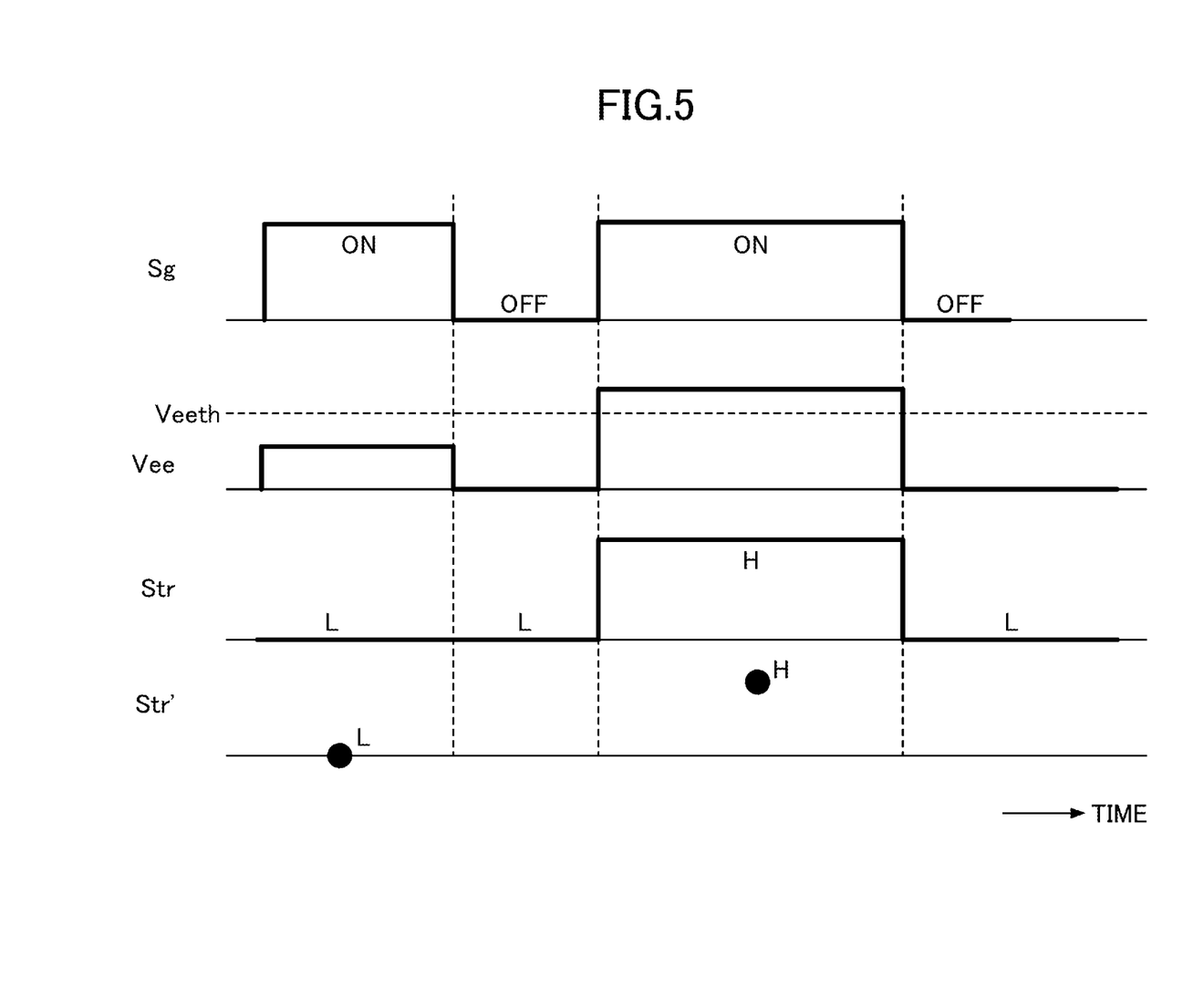
FIG. 5 is a timing chart illustrating an example of an operation of the deterioration determination device according to the first embodiment.

FIG. 5 is a timing chart illustrating an example of the operation of the deterioration determination device according to the first embodiment. The voltage detection circuit 51 detects the voltage Vee, and the trigger circuit 70 compares the detected voltage Vee with a predetermined threshold voltage Veeth by the comparator 71.

The threshold voltage Veeth is set to the voltage Vee at the time of a half-load state of the power converter or the semiconductor device 101 before the deterioration of the semiconductor device 101 progresses, for example. The half-load state of the power converter of the semiconductor device 101 may be defined as a state where an output power is in a range greater than or equal to 40% and less than or equal to 60% of a rated power of the power converter or the semiconductor device 101. Because a generation frequency of a heavy-load state where the output power is close to the rated power is not very high, the determination intervals of the deterioration may become long if the threshold voltage Veeth is set to the voltage Vee at the time of the heavy-load state. On the other hand, because the magnitude of the voltage Vee becomes small at the time of a light-load state where the output power is close to zero, the power converter or the semiconductor device 100 may become easily affected by noise if the threshold voltage Veeth is set to the voltage Vee at the time of the light-load state. Accordingly, when these possibilities are taken into consideration, the threshold voltage Veeth is preferably set to the voltage Vee at the time of the half-load state. The threshold voltage Veeth may be set to the voltage Vee that is lower or higher than the voltage at the time of the half-load state.

The trigger circuit 70 generates the trigger signal Str that assumes a high-level (H) state when the voltage Vee is higher than the threshold voltage Veeth, and assumes a low-level (L) state when the voltage Vee is lower than the threshold voltage Veeth. The trigger signal Str is transmitted to the controller 21 through the isolator 72. The current estimation circuit 23 of the controller 21 reads the trigger signal Str at a specific time during a period in which the IGBT chip Q1 is in the on state, and sets the value of the read trigger signal Str to a value Str'. The value Str' is an example of a timing corresponding to the trigger signal Str. The current estimation circuit 23 estimates the current Ic at the timing when the value Str' makes a transition from the low level to the high level, or from the high level to the low level. The current estimation circuit 23 estimates the current Ic, using the switching command Sg generated by the command circuit 22 and a load current (an AC current iu) detected by the current detection circuit 30.

The specific time during the period in which the IGBT chip Q1 is in the on state is a timing when a predetermined time elapses from a time when the switching command Sg switched from the off command to the on command, and is a timing when the carrier wave assumes a valley as illustrated in FIG. 4, for example. By setting the trigger signal Str to the value Str' at a timing when a certain period elapses from the turn-on of the IGBT chip Q1, the voltage Vee when the excessively large current Ic flows immediately after the turn-on of the IGBT chip Q1 can be excluded from the determination value, thereby improving the accuracy of determining the deterioration.

The deterioration determination circuit 24 computes an estimated value of the electrical resistance component Ree by dividing the threshold voltage Veeth by the current (the current Ic flowing at the timing corresponding to the trigger signal Str) estimated by the current estimation circuit 23. The deterioration determination circuit 24 records the estimated value of the electrical resistance component Ree in the memory in correspondence with an operating time (refer to FIG. 6).

Figure 6:
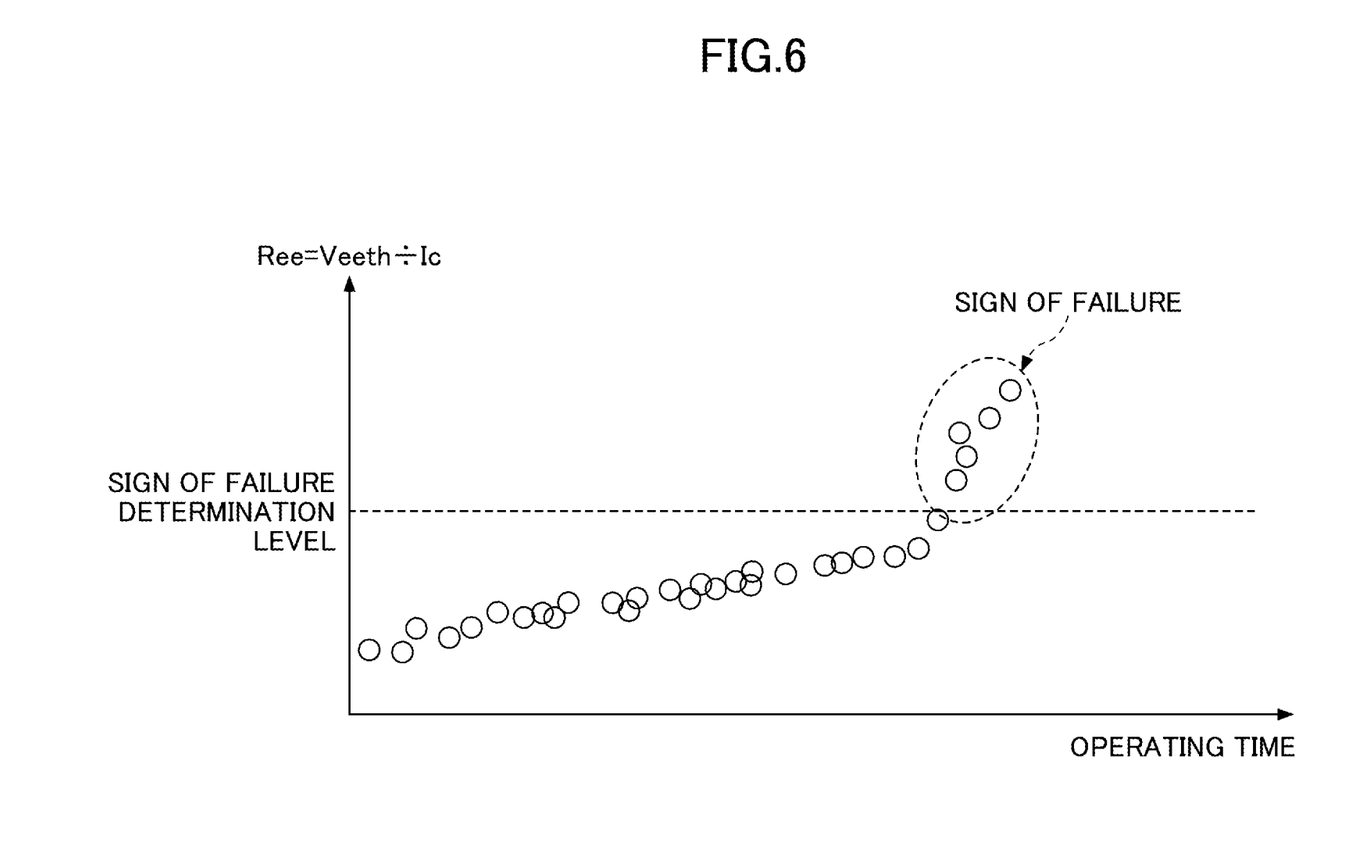
FIG. 6 is a diagram illustrating a change in an estimated value of an electrical resistance component Ree recorded in a memory in correspondence with an operating time.

FIG. 6 is a diagram illustrating a change in the estimated value of the electrical resistance component Ree recorded in the memory in correspondence with the operating time. The deterioration determination circuit 24 determines the deterioration (for example, there is a sign of failure) of the semiconductor device 101 at a point in time when the estimated value of the electrical resistance component Ree exceeds a sign of failure determination level, for example. The estimated value of the electrical resistance component Ree may be an average value of a plurality of estimated values of the electrical resistance component Ree, for example. The deterioration determination circuit 24 may determine that the semiconductor device 101 is deteriorated (for example, there is a sign of failure) when a number of times the estimated value of the electrical resistance component Ree exceeds the sign of failure determination level during a predetermined operating period Tf is greater than or equal to a predetermined number Nf. By considering a plurality of estimated values to determine the deterioration, the possibility of erroneously determining the deterioration due to the noise or the like can be reduced. The deterioration determination circuit 24 may determine the deterioration of the semiconductor device 101 by measuring a tendency of the estimated value of the electrical resistance component Ree to change before exceeding a predetermined value, and predict a deteriorating timing (for example, a failing timing) of the semiconductor device 101. For example, the deterioration determination circuit 24 may predict the deteriorating timing (for example, the failing timing) of the semiconductor device 101, by deriving an intersection point of a regression curve (including a regression line) obtained by regression analysis of a plurality of estimated values of the electrical resistance component Ree and the sign of failure determination level.

The deterioration determination circuit 24 may set the sign of failure determination level, according to a plurality of estimated values of the electrical resistance component Ree at an initial operation stage of the semiconductor device 101. For example, the deterioration determination circuit 24 obtains an average value of the plurality of estimated values of the electrical resistance component Ree at the initial operation stage before the semiconductor device 101 deteriorates, and sets the sign of failure determination level to a value obtained by multiplying or adding a predetermined value to the average value. The initial operation stage before the semiconductor device 101 deteriorates is an initial period from a time t1 to a time t2, where t1 denotes a time when a predetermined initial time elapses from a start of the operation, and t2 denotes a time when a predetermined operating time elapses from the time t1. Thus, the sign of failure determination level that varies depending on a type (a rated capacity or the like) of the power semiconductor element can be set automatically.

The deterioration determination circuit 24 may set the sign of failure determination level to a predetermined value (for example, a value measured in advance at the time of development or at the time of delivery test).

The deterioration determination device 301 according to the present embodiment uses the estimated value of the electrical resistance component Ree as the determination value corresponding to the current (the current Ic flowing at the timing corresponding to the trigger signal Str) estimated by the current estimation circuit 23. However, the determination value may be a value related to the current Ic. In the description given heretofore, the accuracy of determining the deterioration can be improved even when the electrical resistance component Ree is replaced with the current Ic. However, when the electrical resistance component Ree increases due to deterioration, the current Ic decreases. Accordingly, the deterioration determination circuit 24 may determine the deterioration of the semiconductor device 101 (for example, the sign of failure is present) when the estimated value of the current Ic falls below the sign of failure determination level.

Deterioration Determination Device According To Second Embodiment

Figure 7:
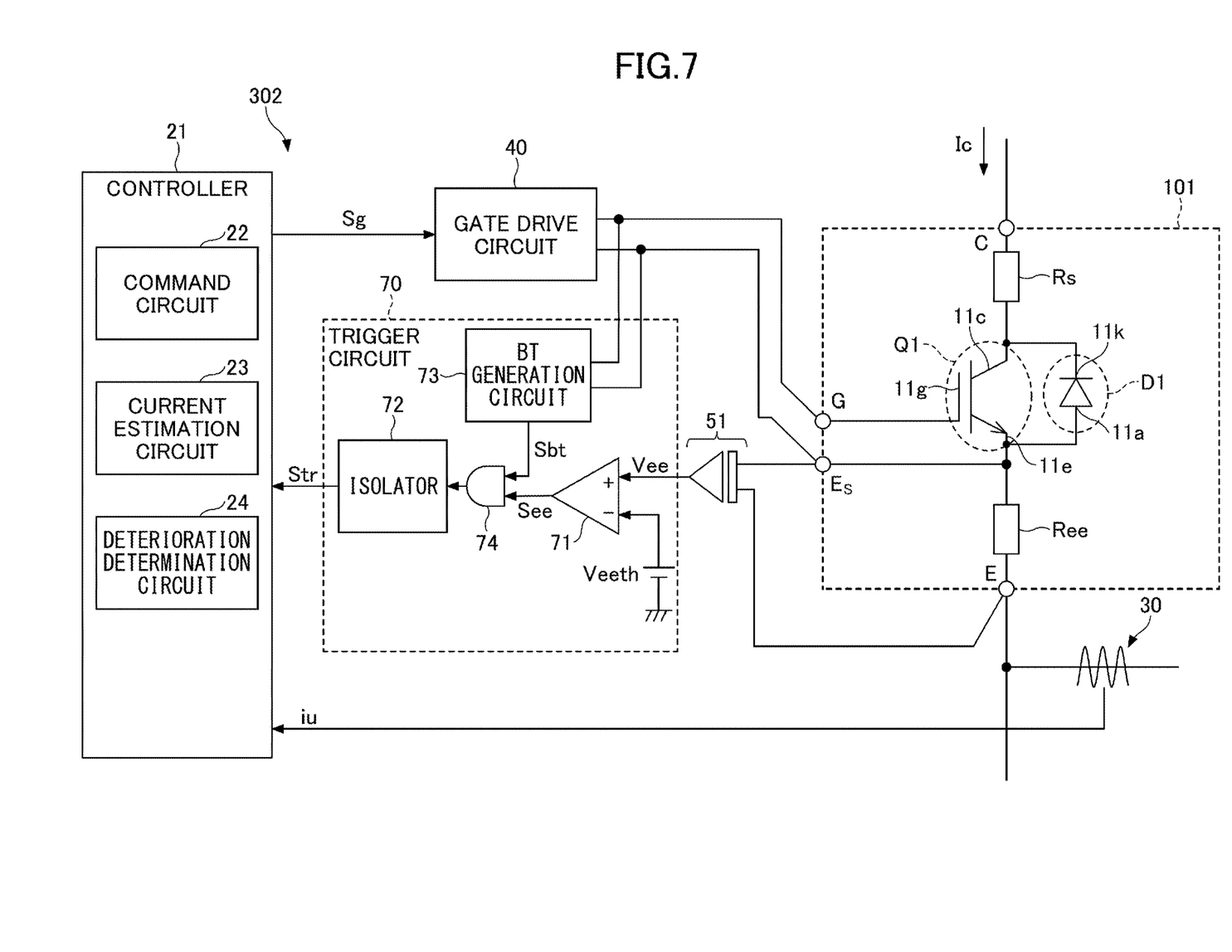
FIG. 7 is a diagram illustrating a configuration example of the deterioration determination device according to a second embodiment.

FIG. 7 is a diagram illustrating a configuration example of a deterioration determination device according to the second embodiment. In the second embodiment, a description of the configuration, operation, and effects that are the same as those of the first embodiment will be omitted by incorporating the description given above. The second embodiment differs from the first embodiment in that the trigger circuit 70 enables the generation of the trigger signal Str after a predetermined time elapses from the turn-on of the IGBT chip Q1.

In the example illustrated in FIG. 7, the trigger circuit 70 includes a blanking time (BT) generation circuit 73 and a logical product gate (an AND gate) 74. The BT generation circuit 73 is a circuit that generates a blanking time (BT). The BT generation circuit 73 is a circuit that delays the trigger signal Str by a blanking time (BT). The AND gate 74 outputs a logical product signal of a pulse signal Sbt output from the BT generation circuit 73 and a signal See output from the comparator 71, as the trigger signal Str.

Figure 8:
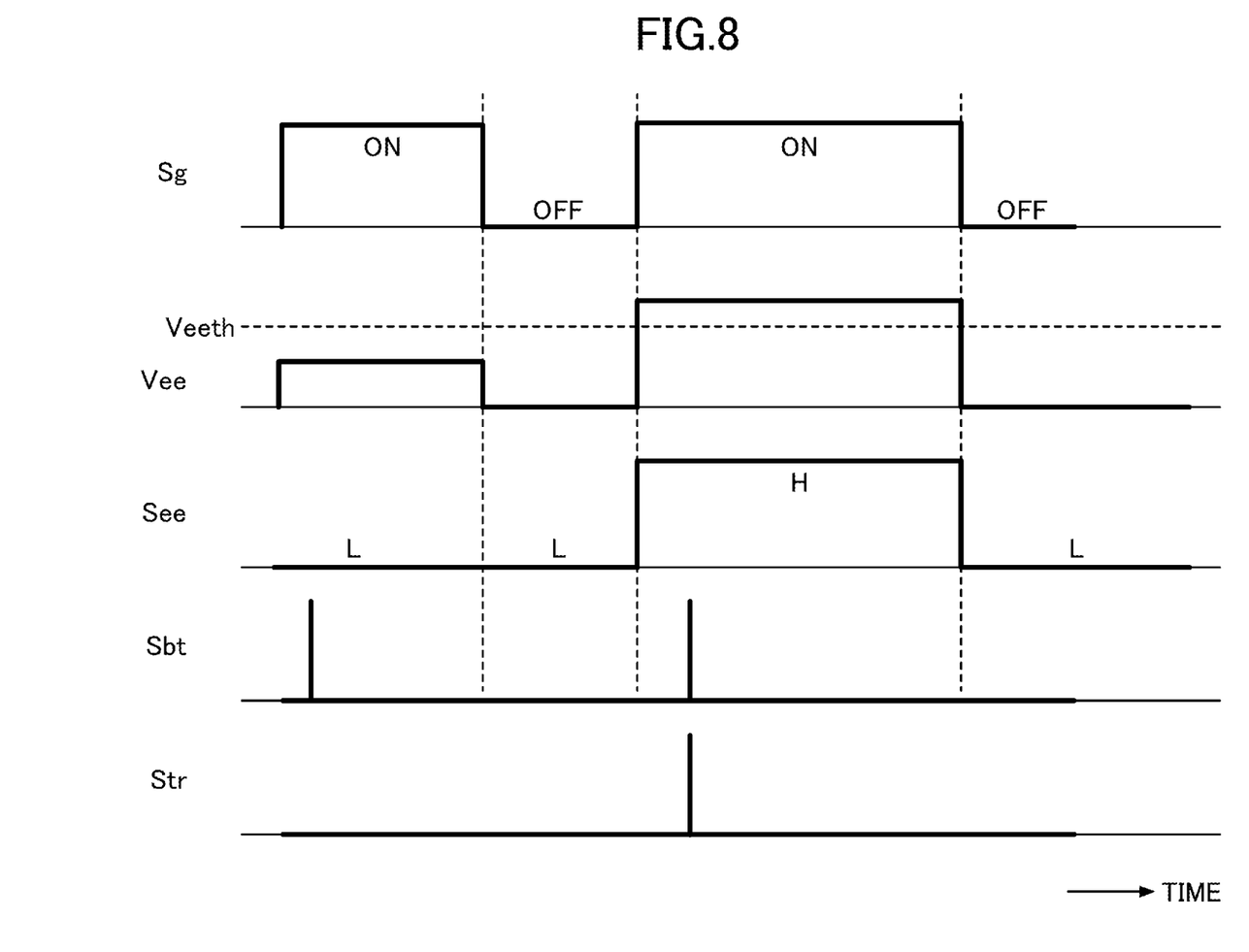
FIG. 8 is a timing chart illustrating an example of the operation of the deterioration determination device according to the second embodiment.

FIG. 8 is a timing chart illustrating an example of the operation of the deterioration determination device according to the second embodiment. The BT generation circuit 73 outputs the pulse signal Sbt when a predetermined blanking time elapses after the switching command Sg makes a transition from the off command to the on command. The AND gate 74 outputs the logical sum signal of the pulse signal Sbt output from the BT generation circuit 73 and the signal See output from the comparator 71, as the trigger signal Str. The trigger signal Str is transmitted to the controller 21 through the isolator 72. The current estimation circuit 23 of the controller 21 reads the trigger signal Str, and estimates the current Ic at the read timing. The operation performed thereafter is the same as that of the first embodiment.

During a transition period in which the IGBT chip Q1 is turned on from the off state, a surge current is generated and an excessively large current flows with respect to the current in a steady state, and thus, an erroneous detection of the voltage Vee may occur. A deterioration determination device 302 according to the second embodiment determines the deterioration of the semiconductor device 101, using the current Ic flowing after the predetermined blanking time elapses from the transition of the switching command Sg from the off command to the on command. Accordingly, it is possible to improve the accuracy of determining the deterioration by not performing the deterioration determination during the period in which the excessively large current of the transition period flows, while synchronizing with the switching operation of the IGBT chip Q1.

In FIG. 8, the means of the trigger circuit 70 for generating the trigger signal Str after the predetermined time elapses from the turn-on of the IGBT chip Q1 is not limited to the BT generation circuit 73 and the AND gate 74. For example, the trigger circuit 70 may include a delay circuit between the voltage detection circuit 51 and the comparator 71, in place of the BT generation circuit 73 and the AND gate 74. In this case, the delay circuit delays a detection signal of the voltage Vee output from the voltage detection circuit 51 by a predetermined time, and outputs the delayed detection signal to the comparator 71. The trigger circuit 70 may generate the trigger signal Str after the predetermined time elapses from the turn-on of the IGBT chip Q1, using such a delay circuit. In addition, the excessively large current of the transition period is caused by the switching speed of the IGBT chip Q1. Hence, the trigger circuit 70 can obtain the same effects even when a lowpass filter having a cutoff frequency lower than the switching speed is provided between the voltage detection circuit 51 and the comparator 71 in place of the BT generation circuit 73 and the AND gate 74.

Deterioration Determination Device According To Third Embodiment

Figure 9:
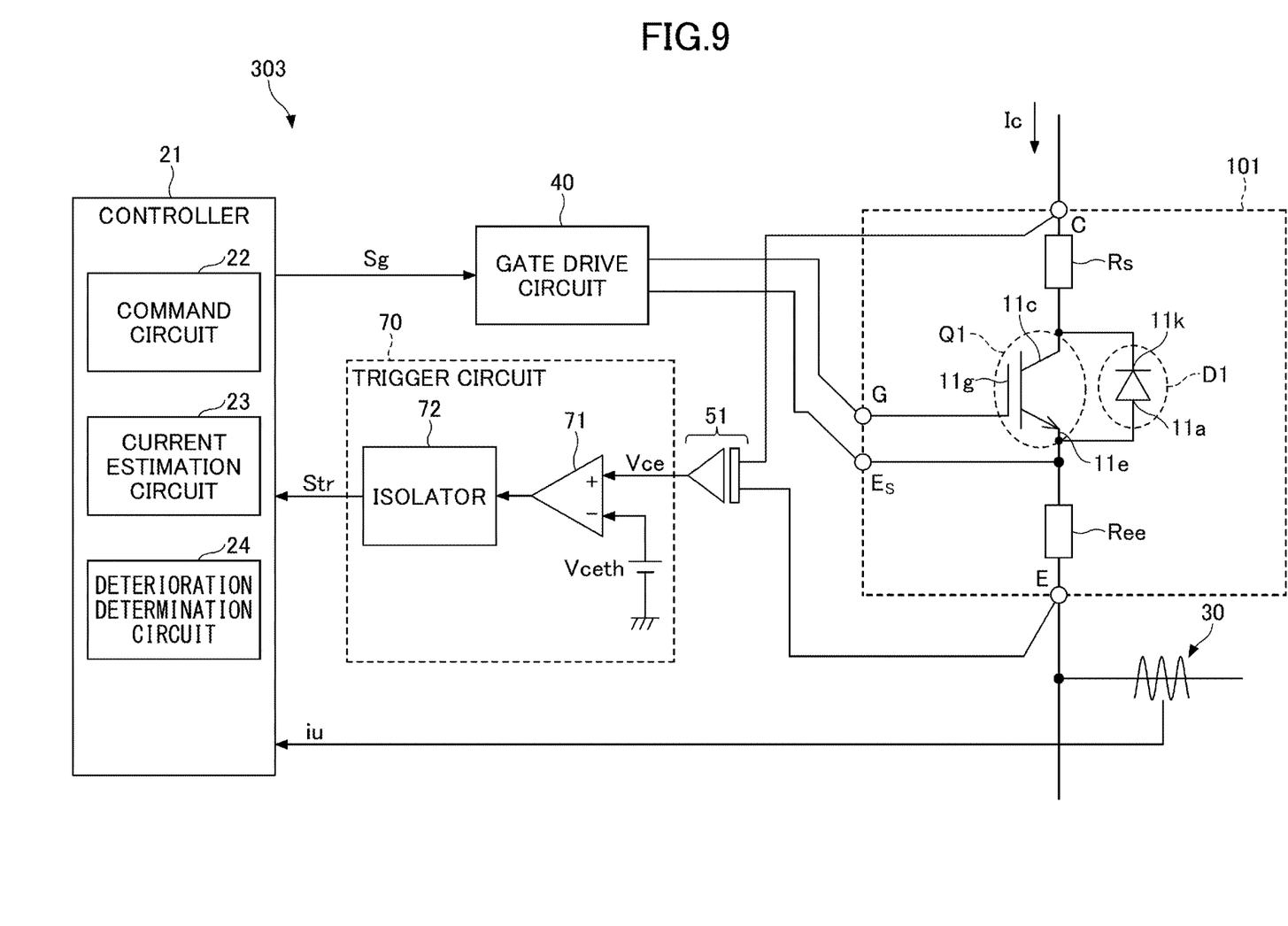
FIG. 9 is a timing chart illustrating an example of the operation of the deterioration determination device according to a third embodiment.

FIG. 9 is a diagram illustrating a configuration example of the deterioration determination device according to a third embodiment. In the third embodiment, a description of the configuration, operation, and effects that are the same as those of the embodiments described above will be omitted by incorporating the description given above.

As the deterioration of the electrical connecting portion between the collector electrode 11c and the collector terminal C progresses, the electrical resistance component Rs increases. A deterioration determination device 303 according to the third embodiment determines the deterioration of the semiconductor device 101 by detecting an increase in a resistance component obtained by combining the electrical resistance component Rs and the electrical resistance component Ree.

According to the third embodiment, the voltage detection circuit 51 detects a voltage Vce between the collector terminal C and the emitter terminal E of the semiconductor device 101, and outputs the detected voltage Vce to the trigger circuit 70. The trigger circuit 70 generates the trigger signal Str when the voltage Vce detected by the voltage detection circuit 51 crosses a threshold voltage Vceth. The operation is otherwise the same as that of the embodiments described above.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present invention have been described in detail, it should be understood that the various changes, substitutions, and alterations could be made hereto without departing from the spirit and scope of the invention.

For example, the semiconductor element is not limited to a power transistor, such as the IGBT, the MOSFET, or the like, and may be a diode, a thyristor, a gate turn-off thyristor, a triode for AC (TRIAC), or the like.

Further, the current estimation circuit 23 or the deterioration determination circuit 24, or both the current estimation circuit 23 and the deterioration determination circuit 24, may be mounted on an external device (for example, an information processor, such as a server or the like, including a computing device) that is different from the control device 20. In this case, the external device can determine the deterioration of the semiconductor device 101 by receiving the trigger signal Str or Str' and the information of the AC current iu or the current Ic between the main terminals.

According to the present disclosure, it is possible to accurately determine the deterioration of the semiconductor device.

Although the embodiments are numbered with, for example, "first," "second," or "third," the ordinal numbers do not imply priorities of the embodiments. Many other variations and modifications will be apparent to those skilled in the art.

What is claimed is:

1. A power converter comprising:
    a semiconductor device including:
        a semiconductor element having a first main electrode, a second main electrode, and a control electrode,
        a first main terminal electrically connected to the first main electrode,
        a second main terminal electrically connected to the second main electrode,
        an auxiliary terminal electrically connected to the second main electrode, and
        a control terminal electrically connected to the control electrode;
    a command circuit configured to generate a command for switching the semiconductor element;
    a drive circuit configured to apply a drive voltage to the control electrode according to the command;
    a voltage detection circuit configured to detect a voltage between the auxiliary terminal and the second main terminal;
    a trigger circuit configured to generate a trigger signal when the voltage detected by the voltage detection circuit becomes greater than or equal to a threshold voltage; and
    a deterioration determination circuit configured to determine deterioration of the semiconductor device, using a determination value corresponding to a current flowing between the first main terminal and the second main terminal in response to the trigger signal.

2. The power converter as claimed in claim 1, wherein the deterioration determination circuit determines the deterioration of the semiconductor device by comparing the determination value with a determination level.

3. The power converter as claimed in claim 2, wherein the determination level is set according to a plurality of determination values at an initial stage of operation of the semiconductor device.

4. The power converter as claimed in claim 1, wherein the deterioration determination circuit determines the deterioration of the semiconductor device, based on a variation tendency of the determination value.

5. The power converter as claimed in claim 1, wherein the determination value is a value related to a current flowing between the first and second main terminals.

6. The power converter as claimed in claim 1, wherein the determination value is a value obtained by dividing the threshold voltage by the current.

7. The power converter as claimed in claim 1, wherein the current flowing between the first and second main terminals is a current flowing between the first and second main terminals at a timing corresponding to the trigger signal.

8. The power converter as claimed in claim 1, wherein the current flowing between the first and second main terminals is a value estimated by a current estimation circuit that estimates a current flowing between the first and second main terminals at a timing corresponding to the trigger signal.

9. The power converter as claimed in claim 8, wherein the current estimation circuit estimates the current flowing between the first and second main terminals, using a detection value of a current output from the first main terminal or the second main terminal.

10. The power converter as claimed in claim 1, wherein the trigger circuit enables generation of the trigger signal after a predetermined time elapses from a time when the semiconductor element turns on.

11. A deterioration determination device comprising:
    a semiconductor device including:
        a semiconductor element having a first main electrode and a second main electrode,
        a first main terminal electrically connected to the first main electrode,
        a second main terminal electrically connected to the second main electrode, and
        an auxiliary terminal electrically connected to the second main electrode;
    a voltage detection circuit configured to detect a voltage between the auxiliary terminal and the second main terminal, or a voltage between the first main terminal and the second main terminal;
    a trigger circuit configured to generate a trigger signal when the voltage detected by the voltage detection circuit becomes greater than or equal to a threshold voltage; and
    a deterioration determination circuit configured to determine deterioration of the semiconductor device, using a determination value corresponding to a current flowing between the first main terminal and the second main terminal in response to the trigger signal.

12. A deterioration determination method for determining deterioration of a semiconductor device including a semiconductor element having a first main electrode and a second main electrode, a first main terminal electrically connected to the first main electrode, a second main terminal electrically connected to the second main electrode, and an auxiliary terminal electrically connected to the second main electrode, the deterioration determination method comprising:
  detecting a voltage between the auxiliary terminal and the second main terminal, or a voltage between the first main terminal and the second main terminal;
  generating a trigger signal when the voltage detected by the detecting is greater than or equal to a threshold voltage; and
  determining deterioration of the semiconductor device, using a determination value corresponding to a current flowing between the first main terminal and the second main terminal in response to the trigger signal.

* * * * *